United States Patent [19]

Muranaka et al.

[11] Patent Number: 5,531,184
[45] Date of Patent: Jul. 2, 1996

[54] METHOD FOR PRODUCING SYNTHETIC DIAMOND THIN FILM, THE THIN FILM AND DEVICE USING IT

[75] Inventors: Yasushi Muranaka, Katsuta; Hisao Yamashita; Hiroshi Miyadera, both of Hitachi, all of Japan

[73] Assignee: Hitachi, Ltd., Tokyo, Japan

[21] Appl. No.: 165,525

[22] Filed: Dec. 13, 1993

Related U.S. Application Data

[63] Continuation of Ser. No. 691,852, Apr. 26, 1991, abandoned.

[30] Foreign Application Priority Data

Apr. 26, 1990 [JP] Japan .................................. 2-108797
Mar. 19, 1991 [JP] Japan .................................. 3-054775

[51] Int. Cl.$^6$ .................................................. C30B 29/04
[52] U.S. Cl. ...................... 117/108; 117/929; 437/103; 437/113; 437/233
[58] Field of Search .................................. 437/103, 113, 437/233; 117/929, 108; 423/446

[56] References Cited

U.S. PATENT DOCUMENTS

4,645,977  2/1987  Kurokawa et al. ..................... 118/715

FOREIGN PATENT DOCUMENTS

| 0265198 | 11/1987 | Japan . |
| 0256596 | 10/1988 | Japan . |
| 0102893 | 4/1989 | Japan . |
| 0131097 | 5/1989 | Japan . |
| 0141897 | 6/1989 | Japan . |
| 0201098 | 8/1989 | Japan . |
| 01204098 | 8/1989 | Japan . |
| 0197391 | 8/1989 | Japan . |
| 0230496 | 9/1989 | Japan . |
| 0261299 | 10/1989 | Japan . |
| 8802792 | 4/1988 | WIPO . |

OTHER PUBLICATIONS

Liou et al. "Effect of Oxygen in Diamond Deposition at Low Substrate Temperatures" Applied Physics Letters Jan. 29, 1990 No. 5, vol. 56 pp. 437–439.

Ong et al. "Low–Temperature Deposition of Diamond Film For Optical Coatings" Applied Physics Letters, vol. 55, No. 20, Nov. 20, 1989 pp. 2063–2065.

Belton et al. "Loss of Epitaxy During Diamond Film Growth on Ordered Ni(100)" J. Appl. Phys. 66(9) Nov. 1, 1989 pp. 4223–4229.

Chen, Chemical Abstracts, vol. 111, No. 24, 111:216632r, p. 132 Dec. 1989.

Deshpandey, Diamond and Diamondlike Films: Deposition Processes and Properties, J. Vac. Sci. & Tech., vol. 7, No. 3, Part A, pp. 2294–2302, May 1989.

Japanese Journal of Applied Physics, vol. 28, No. 12, Part 2, Dec. 1989, pp. L2153–L2154, Tokyo, JP; H. Shiomi et al.: "File–effect Transistors Using Boron–Doped Diamond Epitaxial Films".

Patent Abstracts of Japan, vol. 13, No. 264 (E–774), 19th Jun. 1989; & JP–A–1 055 862 (Sumitomo Electric Ind. Ltd.) Feb. 3, 1989.

(List continued on next page.)

Primary Examiner—Robert Kunemund
Attorney, Agent, or Firm—Antonelli, Terry, Stout & Kraus

[57] ABSTRACT

The present invention provides a method for producing a synthetic diamond thin film which comprises decomposing with microwave a raw material gas containing at least one compound selected from the group consisting of carbon monoxide, carbon dioxide and a hydrocarbon and hydrogen or hydrogen and oxygen to produce a plasma and contacting the plasma with the surface of a substrate held outside the area irradiated with the microwave to form a diamond thin film on the substrate.

The present invention further provides an apparatus for producing a synthetic diamond thin film and a synthetic diamond thin film and devices in which the synthetic diamond thin film is used.

11 Claims, 7 Drawing Sheets

OTHER PUBLICATIONS

Patent Abstracts of Japan, vol. 13, No. 366 (E–806), 15th Aug. 1989; & JP–A–1 123 422 (Sumitomo Electric Ind. Ltd) 16 Jun. 1989.

Applied Physics Letters, vol. 56, No. 5, 29th Jan. 1990, pp. 437–439 New York, US; Y. Liou et al: "Effect of Oxygen in Diamond Deposition at Low Substrate Temperatures".

Applied Physics Letters, vol. 56, no. 7, 12th Feb. 1990, pp. 620–622 New York, US; Y. H. Lee et al.: "Bias–controlled chemicel vapor deposition of diamond thin films".

Chemical Abstracts, vol. 112, No. 6, 5th Feb. 1990, p. 197, Abstr. No. 39117z, Columbus, Ohio, US; H. Kawarada et al.: "Application of Diamond Thin Films to Light Emitting Devices", & Denshi Zairyo 1989, 28(8), 69–73.

Materials Research Bulletin, vol. 24, No. 1, pp. 87–94, C. F. Chen, et al.

Journal of Materials Research, vol. 3, No. 6, pp. 1397–1403, D. E. Meyer, et al.

METHOD FOR PRODUCING SYNTHETIC DIAMOND THIN FILM, THE THIN FILM AND DEVICE USING IT

This application is a Continuation application of application Ser. No. 691,852, filed Apr. 26, 1991, now abandoned.

BACKGROUND OF THE INVENTION

The present invention relates to a purified and highly crystallized synthetic diamond thin film, a method for producing it, an apparatus for producing it, and a device to which the thin film is applied.

It is said that the substrate temperature necessary for growth of a synthetic diamond (hereinafter merely referred to as "diamond") thin film is 750°–900° C. ["Kagaku to Kogyo""(Chemistry and Industry)", Vol. 39, No. 6, pp. 429–431]. According to the data which have hitherto been disclosed in patents and literatures, most of the diamond thin films were grown within the above range of substrate temperature. [Japanese Patent Kokai (Laid-Open) Nos. Sho 62-265198 and Hei 1-230496]. Therefore, high-melting point materials such as silicon and quartz have been generally used as substrates used for growth of diamond thin films. Furthermore, there has been a problem that the synthesized thin films contain impurities comprising amorphous phases in addition to the diamond and so are low in crystallinity.

As mentioned above, the diamond thin film obtained by growing diamond on a substrate heated to high temperatures is inferior in qualities such as purity and crystallinity and there are problems in its use as materials for semiconductor devices, light emitting devices or optical devices for optoelectronics.

SUMMARY OF THE INVENTION

An object of the present invention is to provide a purified and highly crystallized diamond thin film.

Another object of the present invention is to provide a method and apparatus for production of the diamond thin film.

A further object of the present invention is to provide optical devices and electronic devices in which the diamond thin film is used.

A still further object of the present invention is to provide apparatuses in which the above optical devices or electronic devices are used.

DESCRIPTION OF THE INVENTION

The present invention for attaining the above objects is as follows.

That is, the present invention is characterized in that a raw material gas containing at least one of carbon monoxide, carbon dioxide and a hydrocarbon and hydrogen or hydrogen and oxygen is decomposed by an electromagnetic wave to form a plasma, and the plasma is allowed to contact the surface of a substrate held outside the area which is irradiated with the above electromagnetic wave, thereby forming a diamond thin film on the substrate.

In decomposing the raw material gas with the electromagnetic wave such as microwave or radio frequency and contacting the resulting plasma with the surface of the substrate, it is especially important to provide the substrate outside the area irradiated with the electromagnetic wave and in the area where the plasma is generated.

The apparatus for producing the diamond thin film according to the present invention is characterized by comprising a chamber, a means for introducing a raw material gas for synthesis of diamond into the chamber, a means for generation of the electromagnetic wave which decomposes the raw material gas to produce a non-equilibrium plasma, a substrate holder which can place a substrate for formation of the diamond thin film in the position which is outside the area irradiated with the electromagnetic wave and at which the substrate contacts the non-equilibrium plasma, and a means for adjusting the pressure in the chamber.

It is preferred to provide a means for extracting towards the substrate the non-equilibrium plasma produced by decomposition of the raw material gas with the electromagnetic wave by an electric field or magnetic field.

Furthermore, it is desired to provide a means for rotating the substrate holder. By rotating the holder, the plasma can be uniformly contacted with a desired surface of the substrate fitted to the substrate holder. Furthermore, it is desired to provide an device for controlling the temperature of the substrate holder to control elevation of the substrate temperature.

As the raw material gas [shown in a compositional ratio], a gas containing carbon is selected from the following:

| | |
|---|---|
| $CO/O_2/H_2$: | [(0.1–20%)/(1 ppm–10%)/(the balance)] |
| $CH_4/O_2/H_2$: | [(0.1–20%)/(1 ppm–10%)/(the balance)] |
| $CO/CO_2/H_2$: | [(0.1–20%)/(1 ppm–10%)/(the balance)] |
| $CO/CO_2/O_2/H_2$: | [(0.1–20%)/(1 ppm–10%)/ (1 ppm–10%)/(the balance)] |
| $CO/CH_4/O_2/H_2$: | [(0.1–20%)/(1 ppm–20%)/ (1 ppm–10%)/(the balance)] |
| $CH_4/CO_2/H_2$: | [(0.1–20%)/(1 ppm–10%)/(the balance)] |
| $CH_4/CO_2/O_2/H_2$: | [(0.1–20%)/(1 ppm–10%)/ (1 ppm–10%)/(the balance)] |

The raw material gas can contain at most 1 mol ppm of an inert gas. The inert gas includes Ar, He, Ne, Xe, Kr, Rn, etc.

A purified and highly crystallized diamond can be obtained by decomposing the raw material gas with electromagnetic wave such as microwave or radio frequency to form a plasma. Especially, the diamond synthesized using these raw material gases has the feature that it contains quite a little amount of impurities such as amorphous carbon component.

For using the diamond as optical materials or light emitting devices, a preferred structure is such that comprises a substrate such as glass, on the surface of which the diamond is grown.

Figure 1:
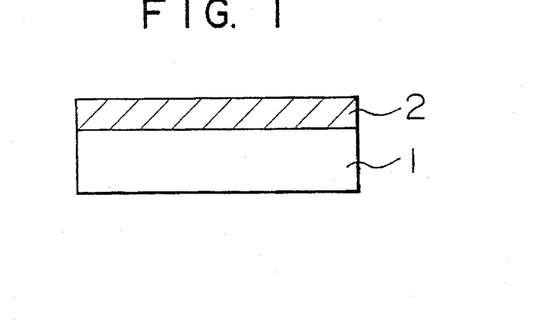
FIG. 1 is a schematic cross-sectional view of a diamond thin film according to one example of the present invention.
Figure 2:
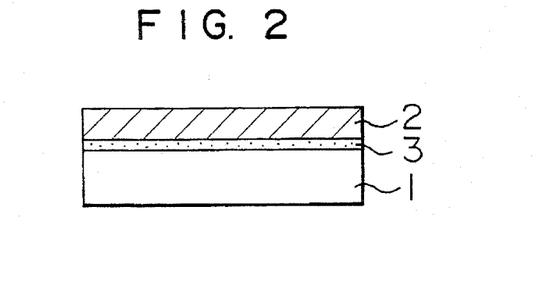
FIG. 2 is a schematic cross-sectional view of a diamond thin film according to another example of the present invention.

FIGS. 1 and 2 show schematic cross-sectional views of the diamond thin film of the present invention. FIG. 1 shows one which comprises substrate 1 such as glass on which diamond layer 2 was deposited and buffer layer 3 may be provided between substrate 1 and diamond layer 2 as shown in FIG. 2 to improve matching with the substrate.

In order to make diamond in a semiconductor device, it is necessary to carry out the epitaxial growth of a diamond single crystal on a substrate of a material such as Cu or Ni other than diamond. For growing the diamond single crystalline film on a substrate other than diamond, it is necessary to select a material having matching with diamond in the lattice constant as the substrate. As such a material, Cu or Ni is preferred. A difference between such material and diamond in the lattice constant is 1% or less and thus the single crystalline film can be sufficiently grown. However, a single crystal substrate of Cu or Ni is very expensive at present and thus it is not so advantageous to use them. Therefore, it is preferred to grow a Cu or Ni thin film as a single crystal on a specific substrate by a vapor deposition method such as MBE (molecular beam epitaxy) and then to grow a diamond single crystalline film thereon.

It is also possible to deposit an amorphous thin film of Cu or Ni on an insulating substrate such as silicon and to carry out the epitaxial growth of the diamond thin film on the amorphous thin film. A layer of Cu or/and Ni may be formed as the buffer layer 3 shown in FIG. 2.

Since general glasses used as the substrate are relatively low in softening point, the temperature for growing the diamond thin film is important. Especially, the softening point of the general glasses other than silica glass is lower than about 920° C. and the growth and deposition of the diamond thin film on such a low softening point material must be carried out at a temperature at which no deterioration of glass occurs. According to the investigation made by the inventors, it has become clear that a temperature lower than the softening point by 100°–200° C. is preferred as the temperature for growth and decomposition of the diamond thin film. Therefore, most of the glasses can be used as the substrate as far as the temperature for growth of the diamond thin film is lower than the softening point of the substrate by 100° C. or more, for example, 750° C. or lower and higher than the atmospheric temperature.

The softening point of the substrate somewhat differs depending on the method of measurement thereof. For example, the softening point can be a temperature of sample to be measured when the viscosity measured by inserting a given rod into the heated sample becomes $10^{11}$–$10^{12}$P (poise). Furthermore, when a sample to be measured is molded in the form of fiber and is placed in a thin tube and heated, a temperature at which the speed of elongation of the sample by its own weight is more than a certain value is employed as the softening point. There are many other methods, but in the present invention, the highest softening point among the softening points obtained by these various methods is employed as the softening point of the substrate material used in the present invention.

The thermal expansion coefficients of glass, Cu and Ni are considerably different from the thermal expansion coefficient of diamond and there is the problem that when a diamond thin film is synthesized and deposited at a high temperature (for example, higher than 750° C.) and the temperature is returned to room temperature, the diamond thin film is peeled off from the substrate. From this point, too, the growing of the diamond thin film is preferably carried out at a temperature as low as possible.

For attaining the growth at a low temperature, it is important to control the substrate temperature in the film forming chamber to a lower temperature. However, when the substrate is directly irradiated with an electromagnetic wave such as microwave or radio frequency, the overheating of the substrate occurs due to the induction heating phenomenon and, therefore, it is important to place the substrate at the position where the substrate is not directly irradiated with the electromagnetic wave and where a plasma formed by decomposition of the raw material gas contacts the surface of the substrate.

Furthermore, the surface temperature of the substrate also rises by the plasma formed by the decomposition and this must be inhibited. One preferred method therefor is to inhibit the overheating of the substrate by reducing the plasma density. For this purpose, the pressure in the chamber of the production apparatus is kept as low as possible. For example, the pressure is 100 Torr or less, preferably 40 Torr to less and $10^{-5}$ Torr or more.

According to another method, the substrate is placed at the position as remote as possible from the plasma area. In this case, since the substrate is away from the plasma area, the plasma is extracted towards the substrate side by externally applying a magnetic field or electric field by providing a means for application of the magnetic field or electric field.

In these methods, since the plasma density is low, the growing rate of the thin film is low and sometimes the highly crystallized diamond thin film cannot be produced. Thus, it is preferred to apply the magnetic field to the plasma to excite the electrons in the plasma. Alternatively, an inert gas such as Ar may be added to activate the plasma.

Moreover, the quality of the diamond thin film can be improved by cooling the substrate. Specifically, a cooling means is provided at the substrate holder and the holder is cooled thereby and the substrate on the holder is cooled due to heat transfer.

With reference to low-temperature growth, a method is proposed which comprises adding hydrogen to a raw material gas such as ketene or diazomethane and forming a diamond thin film on a substrate heated to a temperature lower than 300° C. by the photo CVD (chemical vapor deposition) method by the decomposition of the raw material gas with ultraviolet rays. [Japanese Patent Kokai (Laid-Open) No. Hei 1-261299].

However, the production of atomic hydrogen essential to the synthesis of diamond referred to hereinafter is difficult by this photo CVD method and the synthesis of purified diamond is considered to be impossible. This is because the photon energy of an excimer laser beam (193 nm) used is about 6 eV while the energy necessary for dissociation of hydrogen is 8.8 eV and the production of atomic hydrogen by decomposition of hydrogen with energy is impossible.

In the present invention, the raw material gas is decomposed to form a plasma using the microwave which generates a large energy for production of the atomic hydrogen.

Furthermore, the synthesis of a diamond film by decomposing $CO_2/H_2$ gas by plasma CVD and controlling the substrate temperature to 450°–1200° C. has been proposed [Japanese Patent Kokai (Laid-Open) No. Hei 1-141897], but specifically only the growth at 900° C. is disclosed and the low-temperature growth (at 750° C. or lower) as of the present invention is not referred to.

Japanese Patent Kokai (Laid-Open) No. Hei 1-201098 discloses a method for formation of diamond on a substrate of 400°–1700° C., preferably higher than 700° C. using a hot plasma of higher than 1000K (727° C.), preferably 1500K. This plasma is considered to be a so-called thermal equilibrium plasma. Since this plasma is produced in an atmosphere of a relatively high pressure (several atm.), the temperature in the plasma is very high and thus this method is rather unsuitable for synthesis of diamond of high quality. Furthermore, in this method, an inert gas such as Ar is added in a large amount (69% of the whole gas in Example) to the raw material gas. The purpose of this addition is to cool the substrate or the hot plasma, but the addition of Ar, in such a large amount causes generation of defects or vacancies in the growing diamond.

Japanese Patent Kokai (Laid-Open) No. Hei 1-197391 discloses the decomposition of a raw material gas comprising $CO/H_2$ and an oxygen-containing compound other than CO and $CO_2$ (oxygen per se, water, hydrogen peroxide, methanol, acetaldehyde and the like) with a microwave or radio frequency to form a plasma. However, as can be seen from FIG. 1 of the patent publication, the microwave is directly irradiated to the substrate since the substrate is provided in a microwave cavity. Thus, the substrate is induction heated and it is difficult to keep the substrate substantially at a low temperature.

According to the investigation by the inventors, the diamond thin film synthesized with a raw material gas such as $CO/H_2$ or $CO_2/H_2$ contains an amorphous component such as polyacetylene. The amorphous component is formed due to the polymerization of unsaturated hydrocarbons such as acetylene present in the gas phase on the surface of the growing film. It has been found that when the low-temperature growth is carried out using $CO/H_2$ gas, the polyacetylene is produced in a large amount and this hinders the growth of crystals of purified diamond. It has been confirmed that naturally a larger amount of amorphous carbon or hydrocarbons are readily produced when $CH_4/H_2$ gas is used than when $CO/H_2$ gas is used.

As a result of the intensive research conducted by the inventors, it has been found that when the diamond thin film is grown using a raw material gas such as $CO/O_2/H_2$ or $CH_4/O_2/H_2$ in an atmosphere of atomic hydrogen of a high concentration, a highly crystallized diamond thin film containing less amorphous carbon or the like can be obtained. The presence of atomic hydrogen is clear by optical emission or plasma emission spectroscopy. The inventors have made investigation on raw material gases which can produce atomic hydrogen in a large amount and have found that the above-mentioned gases are suitable therefor and accomplished the present invention.

When the above-mentioned raw material gases of the present invention are used, atomic oxygen, molecular oxygen or OH is produced in a large amount in addition to the atomic hydrogen. These have an effect to remove the amorphous carbon or to hinder the production of polyacetylene on the surface of the thin film and are effective for the purification and the improvement of crystallinity of diamond. Cathodoluminescence analysis shows that in an oxygen-containing atmosphere, diamond less in vacancy and having the similar crystallinity to that of natural diamond can be synthesized at 400° C. It is further confirmed that the growth of purified crystal free from amorphous component is also possible at 130° C. The amount of oxygen is usually 10 mol % or less, preferably 5 mol % or less.

The synthetic diamond of the present invention can be distinguished from other diamond by the following analysis method.

Figure 10:
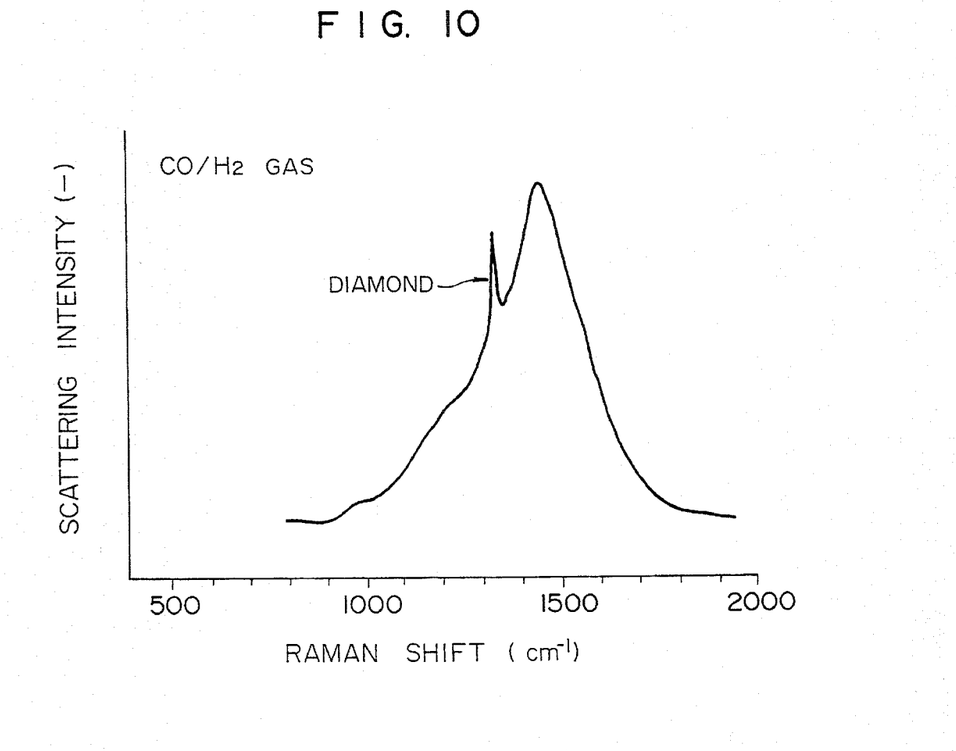
FIG. 10 is a Macro Raman spectrum of a conventional diamond thin film.

The analysis is carried out the by Macro Raman spectroscopy using Ramanor U-1000 manufactured by Jovin Yvon Co. According to this analysis, an argon ion laser of 5145 Å in wavelength (beam diameter: about 100 μm, incident beam intensity: about 200 mW) is projected to the sample to be analyzed at an incidence angle of 90°. Slits used all are of 100 μm in width, the scanning rate is 20 $cm^{-1}$/min, and the scanning wavelength is 300–2100 $cm^{-1}$/min. The Macro Raman spectrum obtained under these conditions is shown in FIG. 10. The sample is a diamond thin film synthesized using $CO/H_2$ gas. A sharp peak which originates in diamond appears at about 1333 $cm^{-1}$. Furthermore, a broad peak which originates in polyacetylene peculiar to the thin film synthesized using $CO/H_2$ gas is seen at about 1450 $cm^{-1}$.

Figure 11:
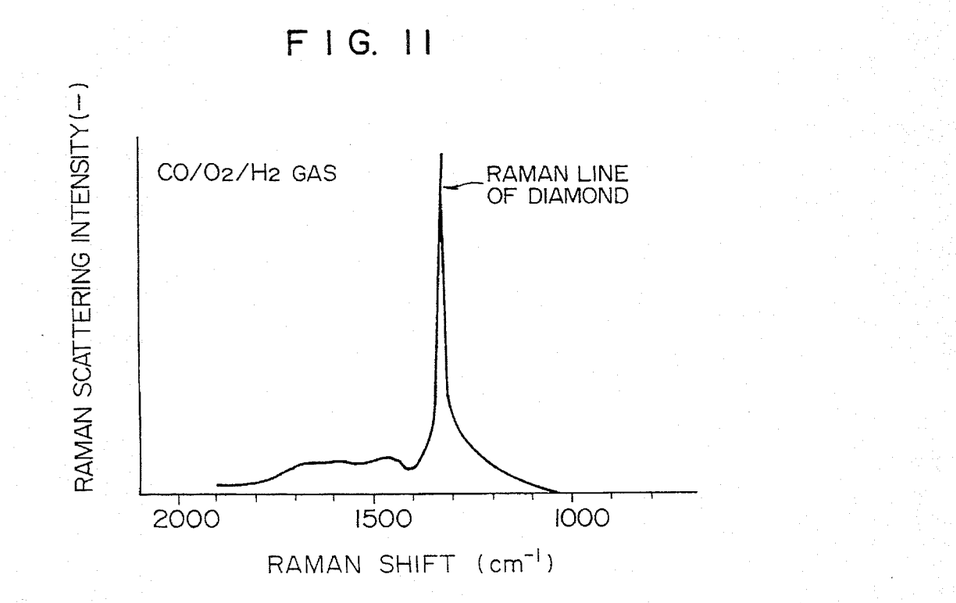
FIG. 11 is a Macro Raman spectrum of a diamond thin film of the present invention.

On the other hand, the peak originating in the polyacetylene is very small in Macro Raman spectrum of the thin film synthesized using $CO/O_2/H_2$ as shown in FIG. 11. This indicates that the production of polyacetylene is hindred. Furthermore, a very sharp peak is seen at 1333 $cm^{-1}$ and this shows that a purified diamond thin film is produced.

When comparison is made on the ratio of peak intensity Ia of polyacetylene at 1450 $cm^{-1}$ and peak intensity Id of diamond at 1333 $cm^{-1}$ (Ia/Id), it has been found that the ratio in the thin film synthesized with the raw material gas of $CO/O_2$ $H_2$ is 3 or less. By this value, it is possible to distinguish the thin film synthesized by the method of the present invention from those which are synthesized by other methods. It is also possible to make the distinction by the high resolution Macro Raman analysis.

Figure 12:
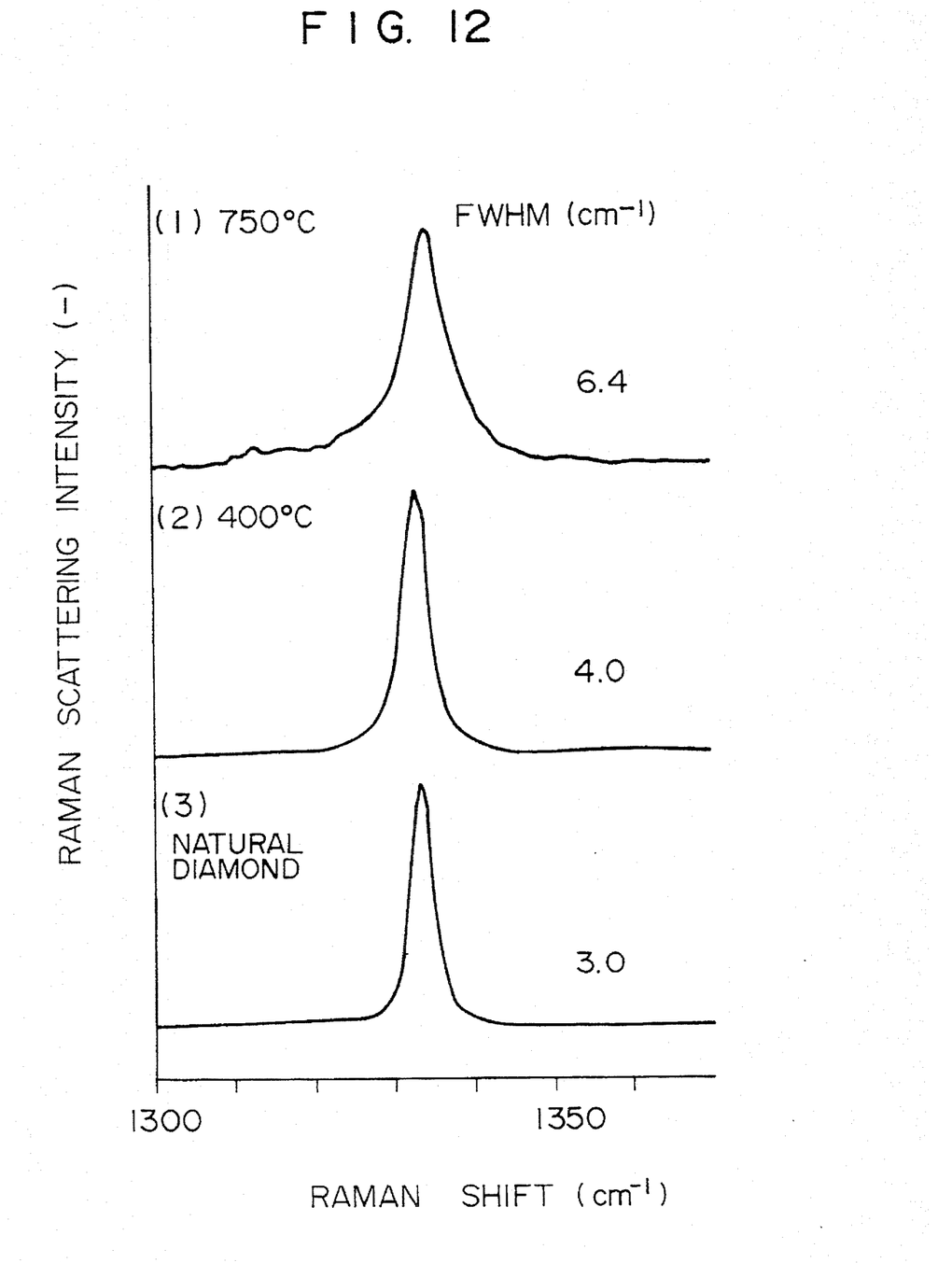
FIG. 12 is a high resolution Macro Raman spectrum of a diamond thin film of the present invention.

The high resolution Raman spectrum is shown in FIG. 12. Under the same analytical conditions, the analysis was conducted with a slit width of 300 μm, a scanning rate of 12 $cm^{-1}$/min, and a scanning wavelength of 1300–1370 $cm^{-1}$. The full width at half maximum of natural diamond is about 3 $cm^{-1}$ while that of diamond thin film synthesized at 750° C. with $CO/H_2$ was 6.4 cm and that of the diamond thin film synthesized at 750° C. with $CO/O_2/H_2$ was 4.0 $cm^{-1}$. Furthermore, a thin film synthesized at 400° C. with $CO/O_2/H_2$ also showed a full width at half maximum of 4.0 $cm^{-1}$.

According to the investigation made by the inventors, it has been confirmed that the full width at half maximum of diamond thin films synthesized with $CO/O_2/H_2$ is 5 cm$^{-1}$ or less irrespective of the synthesis temperature. It is also possible to make distinction from thin films synthesized by other methods by this full width at half maximum.

Furthermore, the diamond thin film of the present invention can also be distinguished from those which are synthesized by other methods by cathodoluminescence analysis (CL method). According to the CL method, an electron beam of 15 kV and 1 μA is irradiated with an irradiation diameter of 50 μm to the sample, and light emission is spectroscopically analyzed by a monochrometer.

Figure 13:
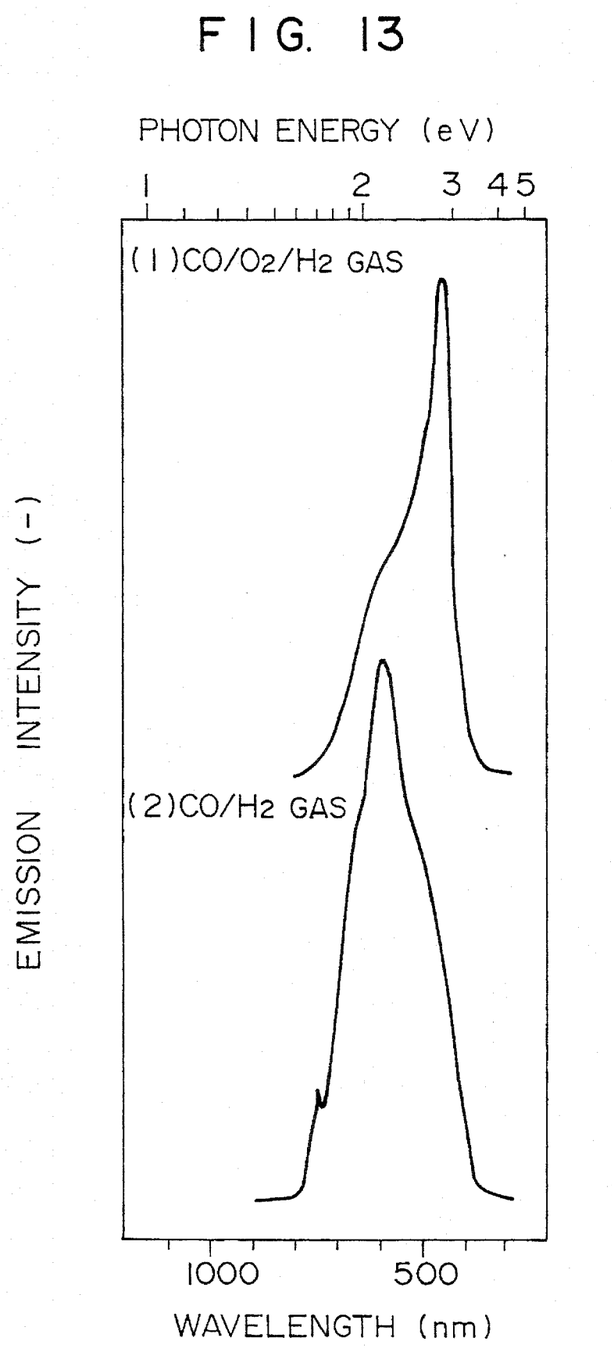
FIG. 13 is a cathodoluminescence spectrum of a diamond thin film of the present invention.

The results of CL analysis are shown in FIG. 13. The diamond thin film has two emissions observed at 600 nm and 430 nm. The diamond thin film synthesized with $CO/H_2$ is strong in emission intensity of broad green peak at 600 nm. On the other hand, in the diamond thin film synthesized with $CO/O_2/H_2$, the blue emission at 430 nm is stronger. It has been found that the ratio of the intensity Ib of a blue light emission and the intensity Ig of a green light emission (Ib/Ig) is 2 or more for the thin film synthesized with $CO/O_2/H_2$. It is also possible by this value to distinguish the thin film of the present invention from those which are synthesized by other methods.

Next, an apparatus for producing the diamond thin film according to the present invention will be explained.

Figure 3:
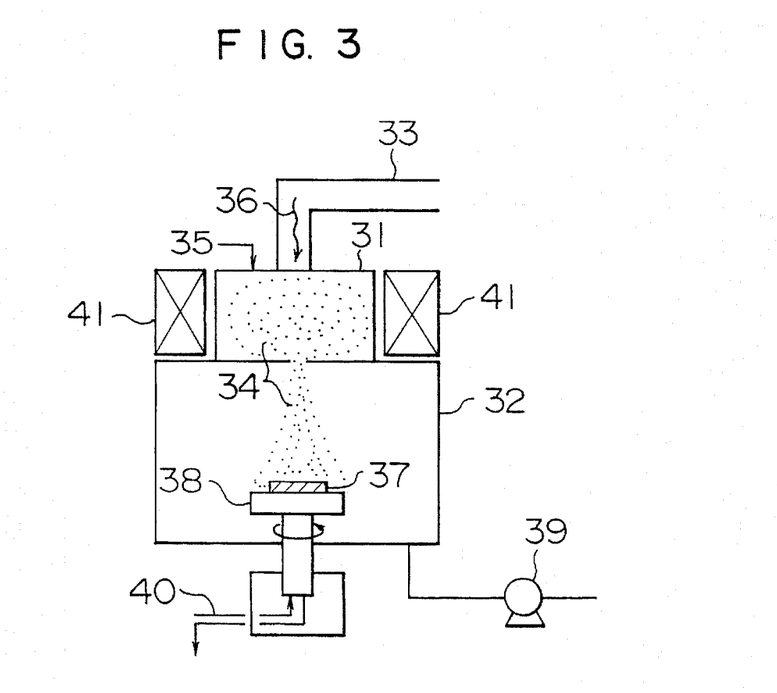
FIG. 3 is a schematic sectional view of an apparatus for producing the diamond thin film according to the present invention.

FIG. 3 schematically shows one example of the apparatus. Microwave 36 is irradiated into chamber 32 made of quartz or stainless steel by microwave cavity 33. Raw material gas 35 supplied to chamber 32 is excited and decomposed by microwave 36. The apparatus is constructed so that microwave 36 does not escape from plasma chamber 31 towards substrate 37. Arrangement is made so that plasma 34 produced by the decomposition of raw material gas 35 contacts substrate 37 and substrate 37 is fixed on holder 38. Construction is made so that holder 38 is cooled by cooling water 40. Substrate 37 is heated by contacting plasma 34, but the surface temperature must not exceed 750° C. Chamber 32 is evacuated by vacuum pump 39 and is kept at a pressure of 10 Torr or lower. Further, magnetic field coil 41 is positioned so that it can apply magnetic field to the plasma. This apparatus is effective for the formation of a diamond thin film of a large area.

Figure 4:
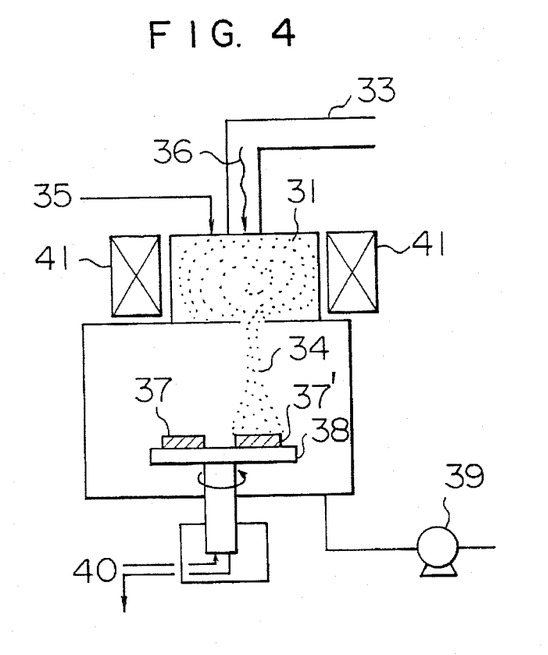
FIG. 4 is a schematic sectional view of another apparatus for producing the diamond thin film according to the present invention.

FIG. 4 also shows an apparatus similar to the above one, but a plurality of substrates 37, 37' are fixed on the rotating substrate holder 38 and plasma 34 is irradiated to only one of substrates 37 and 37'. According to this apparatus, since the plasma can be intermittently irradiated to the substrate, overheating of the substrate can be inhibited and so the diamond thin film can be stably grown. Furthermore, the substrate may be cooled by cooling water 40 as in FIG. 3.

Figure 5:
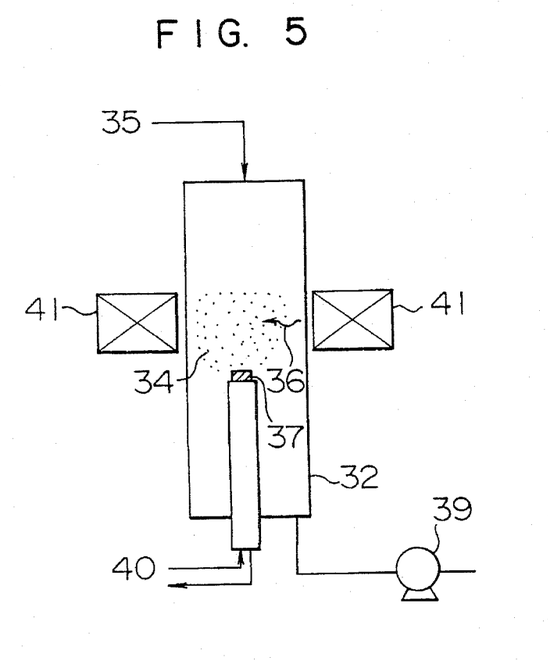
FIG. 5 is a schematic sectional view of another apparatus for producing the diamond thin film according to the present invention.

FIG. 5 schematically shows another example of the apparatus. Microwave 36 is irradiated in parallel to chamber 32 made of quartz to convert the raw material gas to plasma. In this case, substrate 37 is placed at such position as plasma 34 can contact the surface of the substrate and microwave is not directly irradiated to the substrate. This positional relation between the substrate and the plasma is very important. This is for inhibition of overheating of the substrate due to the induction heating by microwave and heating and boiling of cooling water 40.

Figure 6:
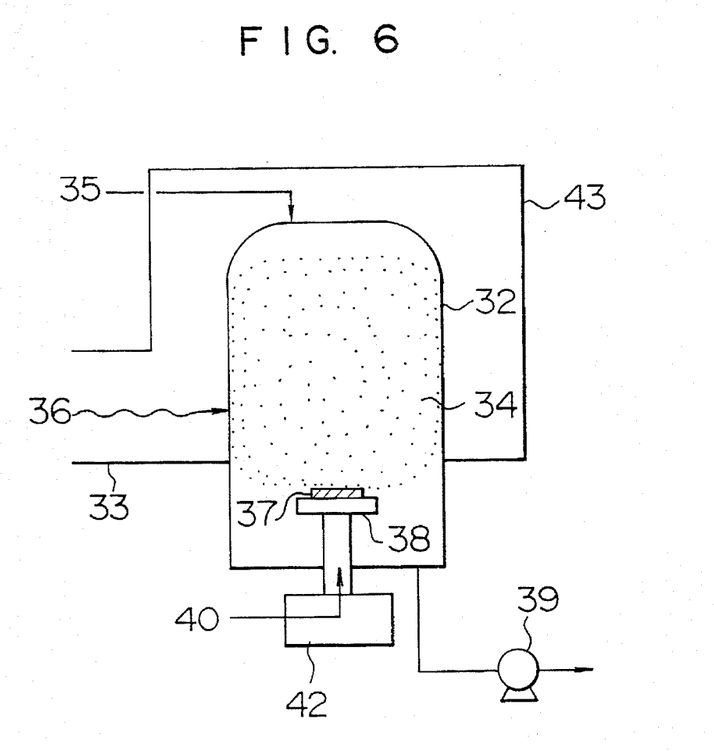
FIG. 6 is a schematic sectional view of another apparatus for producing the diamond thin film according to the present invention.

FIG. 6 schematically shows another example of the apparatus. Raw material gas 35 is fed to chamber 32 made of quartz and is excited by microwave 36. Chamber 32 is surrounded by protective wall 43 to inhibit the leakage of microwave. Substrate 37 is placed at the position lower than microwave cavity 33 in such a manner that plasma 34 contacts the surface of the substrate. This is also for inhibition of induction heating of the substrate by the microwave. Substrate 37 is fixed on substrate holder 38 and is cooled by cooling water 40, whereby control of synthesis temperature becomes further easier. When the substrate is rotated by rotator 42, the synthesis of more uniform thin films becomes possible. Furthermore, as shown in FIG. 4, a plurality of substrates are placed on substrate holder 38 and the plasma is intermittently contacted with respective substrates by rotating the holder, whereby plasma can be irradiated at a low temperature and thus the synthesis of diamond thin films of high quality becomes possible.

Next, explanation will be made on a device with the diamond thin film synthesized above and an electronic apparatus in which the device is used.

Figure 7:
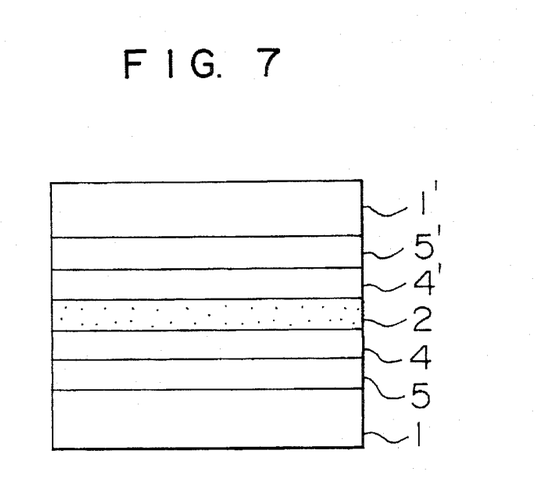
FIG. 7 is a schematic cross-sectional view of a display device in which the diamond thin film of the present invention is used.

FIG. 7 is a side-sectional view of a display device in which the diamond thin film is used. On both the sides of diamond layer 2 are provided insulating layers 4, 4', transparent electrodes 5, 5', and low-softening point glass substrates 1, 1'. When an electric field is applied to diamond layer 2 by transparent electrodes 5, 5', the diamond layer emits light. A display apparatus is obtained by arraying the display devices.

Figure 8:
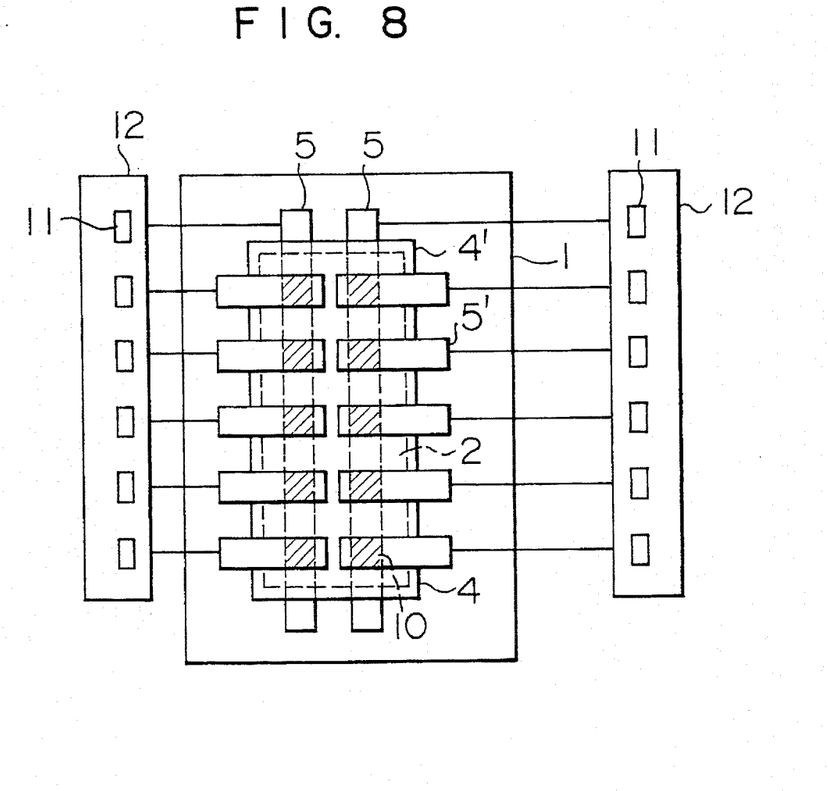
FIG. 8 is a schematic view of a display device in which the diamond thin film of the present invention is used.

FIG. 8 schematically shows a display apparatus obtained by arraying the above display devices. On the surface of glass substrate 1 were stacked thin films of transparent electrode 5, insulating layer 4, diamond layer 2, insulating layer 4', and transparent electrode 5' in this order and thus, a plurality of light emitting devices 10 (the portion of oblique lines in FIG. 8) are formed. The structure of one light emitting device 10 is as shown in the cross-sectional view of FIG. 7. This light emitting device 10 emits light when an electric field is externally applied thereto by transparents 5, 5'. Desired light emitting devices can be lighted to display images by controlling application of the electric field by driving transistor 11 and control unit 12. Since the band gap of diamond is large, namely, 5.2 eV, emission of from blue light to ultraviolet light is possible and the diamond can be utilized for the display light emission apparatus.

Figure 9:
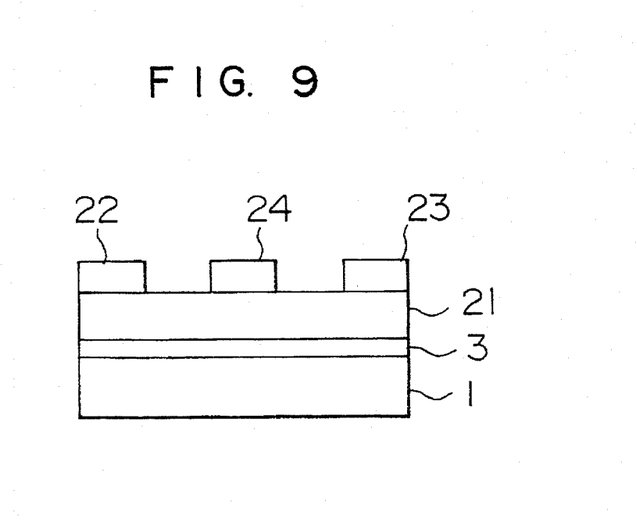
FIG. 9 is a schematic cross-sectional view of a semiconductor device in which the diamond thin film of the present invention is used.

FIG. 9 is a cross-sectional view of a diamond transistor. This is a transistor having a diamond semiconductor layer and having switching function. Buffer layer 3 comprising Cu, Ni or a laminate thereof is provided on substrate 1 and thereon is provided diamond semiconductor layer 21. On this diamond semiconductor layer 21 are provided drain electrode 22, source electrode 23, and gate electrode 24. Current flowing between drain 22 and source 23 can be controlled by adjusting the voltage applied to gate electrode 24.

Furthermore, the diamond can be used as a phosphor of a Braun tube, especially color Braun tube. That is, the diamond thin film is applied to the fluorescent screen formed on the inner surface of the face panel of the Braun tube having an electron gun, a deflection coil which deflects the electron beam emitted from the electron gun based on external signal and a shadow mask.

Japanese Patent Kokai (Laid-Open) No. Hei 1-102893 discloses a light emitting device comprising a transparent substrate of a material such as plastic or glass on which a diamond thin film is deposited, but makes no specific reference to the properties of the substrate and synthetic diamond.

As aforementioned, the growth of conventional diamond thin films has been carried out at high temperatures (higher than 750° C.) and, hence, the materials of the substrate have been restricted. Especially, for utilization as display devices, low-softening point glass substrates must be inevitably used.

Conventionally used substrate materials all have a high softening point and besides are relatively close to diamond in thermal expansion coefficient. For example, "New Diamond", Vol. 5, No. 4, pp. 44–45 shows a light emitting device having an EL (electro-luminescence) structure. However, this device comprises an n-type silicon substrate having a double insulating layer of hafnium oxide or alumina and a polycrystalline diamond thin film provided on the insulating layer.

On the other hand, according to the present invention, since the diamond thin film of high quality can be formed on a low-softening point substrate, this can be used as an optical device or a light emitting device.

Diamond is a semiconductor belonging to Group 4 of the periodic table like silicon. In the future, diamond will probably be used as various semiconductor devices and in this case, an epitaxial thin film is desirable. For epitaxial growth of diamond, a material close to diamond in lattice constant must be selected as the substrate. The material having a lattice constant close to that of diamond is naturally a single crystal diamond. However, the single crystal diamond is produced by a high-pressure method and has a small size of about 1–5 mm square and so mass-production of the devices is difficult and is not practical.

The lattice constant of Cu or Ni differs by 1% of less from that of diamond, and Cu or Ni is suitable for growing the single crystal of diamond thereon. However, the thermal expansion coefficient of Cu or Ni is greatly different from that of diamond. Therefore, there is the problem that although the thin film can be grown by a conventional method (at higher than 750° C.), the thin film is peeled off when the temperature is returned to room temperature after completion of growth. The present invention is very effective for growing the diamond single crystal on Cu or Ni because the diamond thin film is grown at a low temperatures. A single crystal substrate of Cu or Ni can be used, but this is expensive and is not practical. Therefore, it is desired that a thin film of Cu or Ni is first grown as single crystal on a substrate of, for example, silicon by a vapor deposition method such as MBE and a diamond thin film is grown thereon.

Furthermore, it is also possible to deposit an amorphous thin film of Cu or Ni on a substrate of, for example, silicon and then to epitaxially grow a diamond thin film thereon. According to this method, a transistor can be made in which diamond is used as a semiconductor.

Conventional diamond thin films are all polycrystalline and since such polycrystals comprise many crystallites, they contain vacancies called grains or amorphous regions between crystals. These hinder movement of carriers in the diamond to cause deterioration of function of transistors. The single crystal thin film of diamond according to the present invention contain no such grains and is extremely superior in making semiconductor devices.

Especially, since diamond has a band gap of 5.2 eV which is larger than that of silicon or the like, the soft error phenomenon due to the radiation hardly occurs and, especially, application to semiconductor devices such as electron devices used in cosmic space can be expected. Moreover, diamond is higher in mobility of carrier at a high temperature than Si and GaAs and is preferred also as devices used at high temperatures.

There is a method of depositing diamond on flaky Cu of 10–100 μm by coating at 700° C. [Japanese Patent Kokai (Laid-Open) No. Hei 1-131097]. However, owing to the great difference in the thermal expansion coefficient between diamond and copper, the diamond film coated at 700° C. is considered to be peeled off very easily. According to the present invention, the synthesis of diamond thin films is possible even at a temperature as low as room temperature—200° C. and thus, the present invention is suitable for coating on Cu.

The growth of diamond thin films at about room temperature can be carried out by the apparatus as shown in FIG. 3. There is a disadvantage that the growing rate of the thin film decreases with decrease of the temperature, but such disadvantage can be solved by exciting electrons in plasma by application of a magnetic field, thereby activating the plasma. Moreover, the plasma can be activated by adding an inert gas such as Ar. Ar has a life of a meta-stable excited state which is much longer than that of other chemical species and so is high in its effect. Ar which has a high internal energy as mentioned above has further actions such as acceleration of decomposition of other chemical species in the plasma and acceleration of crystallization reaction on the surface of the substrate.

On the other hand, Ar has a long atomic radius and so has the defect that it attacks the substrate or the thin film during formation and damages them. Especially, the influence of ionized Ar is large. In order to improve the defect, a positive potential is applied to the substrate and the amount of the ionized Ar is controlled, whereby the irradiation damage can be inhibited.

There has been proposed a method according to which a substrate is placed inside or outside a microwave plasma, the temperature of the substrate is adjusted to 300–1500° C., and Ar, an organic compound and hydrogen introduced are decomposed to form a plasma, thereby to deposit diamond. [Japanese Patent Kokai (Laid-Open) No. Sho 63-256596]. However, only the results obtained as 800° C. are described in its examples and the low-temperature growing method is not described. Besides, the publication mentions the examples of using a microwave of 200 W, but according to the experiments conducted by the inventors, if a plasma generated with a microwave of 80 W is allowed to contact a substrate, the substrate is heated to higher than 400° C. Therefore, in the case of the microwave output being 200 W, it seems that the substrate temperature rises to at least 500° C. In order to lower the substrate temperature, it is considered from FIG. 1 of the publication that the substrate must be placed outside the plasma produced with microwave. However, according to the experiments conducted by the inventors, when the substrate is placed at such a position, no diamond thin film was formed.

The thermal expansion coefficient of Cu or Ni greatly differs from that of diamond, but according to the present invention this causes substantially no trouble. In FIG. 1, in the case of substrate 1 being a single crystal of Cu or Ni, diamond thin film 2 becomes single crystal.

According to the synthesis method of the present invention, Raman shift resulting from the diamond bond obtained by Raman scattering spectral diffraction can be made nearly constant in the direction of film thickness, and diamond having a less amount of disordered crystal lattice can be obtained. Especially, the deviation of Raman shift resulting from diamond bond in the direction of film thickness can be controlled within ±1 cm$^{-1}$.

When the diamond thin film is used for light emitting device, the trap state caused by disorder of crystal lattice occurs during light emission transition in the case of the thin film having a large amount of disordered crystal lattice. The presence of the trap state is apt to cause non-radiative transition, which often results in broadening of spectrum and decrease of luminance. In the diamond thin film of the present invention, there is a little, trap state due to the disorder of lattice and spectrum is sharp and besides, light emitting devices of a high luminance can be obtained.

The present invention will be explained specifically by the following examples.

Example 1

Using an apparatus as shown in FIG. 5, a diamond thin film was formed on a low-melting point glass (CORNING GLASS 7059) substrate having a softening point of 844° C. The reaction cell (quartz chamber) had a diameter of 15 mm and the substrate was placed at the position at a distance of 5 mm below the lower end of microwave cavity. Microwave output was kept at a constant of 80 W and pressure in the chamber was 1 Torr. The temperature of the substrate was 350° C. at the state of the substrate surface being contracted with the plasma generated. The temperature of the substrate was monitored by a thermocouple and adjusted to 400° C. by supplemental heating.

$CO/O_2/H_2$ gas was used as a raw material gas. CO concentration was 8%, $O_2$ concentration was 2.2%, and the balance was $H_2$. The growing time of the diamond thin film was 3 hours. The film forming rate was 0.1 μm/hr.

The structure of the resulting diamond thin film was as shown in FIG. 1. Macro Raman analysis revealed a sharp peak of diamond at 1333 $cm^{-1}$ which was similar to the peak shown in FIG. 11. The Raman scattering intensity ratio Ia/Id was 0.4. The full width at half maximum according to high resolution Raman analysis was 4.0 $cm^{-1}$. Blue light emission was obtained in cathode luminescence spectrum and the emission intensity ratio Ib/Ig was 2.5.

Example 2

A diamond thin film was formed in the same manner as in Example 1, except that Ar (flow rate 5 sccm) was added to the raw material gas. The resulting thin film had the properties similar to those of the thin film obtained in Example 1. Film forming rate was 0.5 μm/hr, which was 5 times that in Example 1. As a result of Raman analysis, it was found that diamond having the film properties similar to that of Example 1 was synthesized.

Example 3

A Cu thin film of 200 Å in thickness was formed on a silicon substrate by vapor deposition and thereon was formed a diamond thin film under the same conditions as in Example 1 to obtain a structure as schematically shown in FIG. 2. The results of Raman analysis of the diamond thin film were the same as in Example 1.

Example 4

A diamond thin film was synthesized in the same manner as in Example 1 using the low-melting point glass substrate as used in Example 1. The temperature of the substrate was adjusted in the range of 200°–600° C. The temperature was able to be adjusted until 400° C. without water cooling, but water cooling was necessary for adjustment to higher than this temperature. Thin films synthesized with changing the temperature by every 100° C. were subjected to the Raman spectroscopic analysis. As a result, it was confirmed that the diamond thin films having good crystallinity similar to that of the thin film obtained in Example 1 were formed.

Example 5

Thin film were synthesized in the name manner as in Example 4 using the apparatus as schematically shown in FIG. 3. Water cooling was required for adjusting the temperature of the substrate to lower than 600° C. Films were formed at various temperatures by adjusting the temperature of the substrate in the range of 200°–600° C. Thin films synthesized with changing the temperature by every 100° C. within the above range were subjected to the Raman spectroscopic analysis. As a result, it was confirmed that diamond thin films of good crystallinity were synthesized.

Example 6

Diamond thin films were synthesized at temperatures in the range of from room temperature to 750° C. using the apparatus of FIG. 5. The gas used was CO (7%)/$O_2$ (2.2%)/$H_2$ (the balance). Microwave output was at a constant of 80 W. The substrate was able to be heated to only lower than 350° C. by this output and so heated to higher than 350° C. using a supplemental heater. The whole of the apparatus of FIG. 5 was air-cooled by ventilator for cooling to lower than 350° C. The Macro Raman spectrum of the diamond thin film synthesized at room temperature—750° C. was similar to that of FIG. 11. The peak of diamond was seen at 1333 $cm^{-1}$. Substantially no peaks of amorphous components were recognized. The full width at half maximum of the peak of diamond was 4 $cm^{-1}$ according to the Macro Raman spectroscopy.

The cathode luminescence spectrum at room temperature was as shown in FIG. 13 and the light emission intensity ratio Ib/Ig was 2.5. It was found that the thin film obtained in this example had a specific structure comprising isolated particles of 3–5 μm. Purified and highly crystallized diamond was synthesized using the gas of the present invention. Different from conventional columnar crystallite, the diamond had a clear crystal form and comprised large grains. On the other hand, thin films obtained using silicon as a substrate were all polycrystallities. The thin films synthesized using $CO/H_2$ gas were all columnar crystallites.

Example 7

A diamond thin film was synthesized on a single crystal of Cu using the apparatus as schematically shown in FIG. 6. The substrate was water-cooled to adjust the growing temperature to about 50° C., and the degree of vacuum of the chamber was 1 Torr. CO (8%)/$O_2$ (2.2%)/$H_2$ (the balance) was used as raw material gas. After growing for 3 hours, the resulting thin film was analyzed to find that a thin film similar to that of Example 6 was obtained. The crystal structure thereof was single crystal diamond.

According to the present invention, materials of a low melting point can be used as a substrate on which the diamond thin film is to be formed. Furthermore, a diamond single crystal film can be grown on Cu or Ni.

Besides, according to the present invention, the adhesion between the diamond thin film and the substrate is improved and residual stress in the film can be reduced. Highly crystallized thin film less in impurities, especially amorphous portion can be synthesized when formation of the film is carried out at low temperatures.

The diamond thin film obtained by the present invention can be applied to devices such as a semiconductor device, optical device, light emitting device, and opto-electronics. Moreover, displays of high quality can be provided by using the devices.

What is claimed is:

1. A method of producing a synthetic, highly crystallized, diamond thin film, which comprises decomposing with microwave a raw material gas mixture selected from the group consisting of $CO/O_2/H_2$, $CO/CO_2/O_2/H_2$, and $CO/CH_4/O_2/H_2$ at low temperature of 750° C. or lower to produce a non-equilibrium plasma, and contacting the plasma with the surface of the plasma being held outside the area irradiated with the microwave to form the highly crystallized diamond thin film on the substrate; the substrate comprising a glass and surface temperature of the substrate being controlled to be lower than the softening point of the material of the substrate by 100° C. or more and higher than the atmospheric temperature.

2. A method according to claim 1, wherein the concentration of an inert gas as an impurity in the raw material gas mixture is at most 1 mol ppm.

3. A method according to claim 1, wherein the content of oxygen in the raw material gas mixture is in the range of 1 mol ppm—5 mol %.

4. A method according to claim 1, wherein the pressure of the plasma atmosphere of the raw material gas mixture is in the range of $10^{-5}$–$10^2$ Torr.

5. A method according to claim 1, wherein the gas mixture is selected from the group consisting of $CO/O_2/H_2$ and $CO/CO_2/O_2/H_2$; the content of oxygen in the raw gas mixture being in the range of 1 mol ppm—5 mol %.

6. A method of producing a synthetic, highly crystallized, diamond thin film, which comprises decomposing with microwave a raw material gas mixture selected from the group consisting of $CO/O_2/H_2$, $CO/CO_2/O_2/H_2$, and $CO/CH_4/O_2/H_2$ at low temperature of 750° C. or lower to produce a non-equilibrium plasma, contacting the plasma with the surface of a substrate held outside the area irradiated with the microwave and controlling the surface temperature of the substrate to be lower than the softening point of the material of the substrate by 100° C. or more and higher than the atmospheric temperature to form the highly crystallized diamond thin film on the substrate; said substrate comprising a low-melting point material or a material having a lattice constant differing by 1% or less from that of the highly crystallized diamond thin film.

7. A method according to claim 6, wherein the substrate has on the surface thereof a vapor deposited film of at least one material selected from the group consisting of Cu and Ni.

8. A method according to claim 6, wherein the substrate has on the surface a single crystal film or an amorphous film of at least one material selected from the group consisting of Cu and Ni.

9. A method according to claim 6, wherein the substrate comprises a thin film of Cu or Ni deposited on a silicon substrate, said highly crystallized diamond thin film being formed on the thin film of Cu or Ni.

10. A method according to claim 6, wherein the substrate comprises a Cu or Ni layer having a high coefficient of thermal expansion.

11. A method of producing a synthetic, highly crystallized, diamond thin film, which comprises decomposing with microwave a raw material gas mixture selected from the group consisting of $CO/O_2/H_2$, $CO/CO_2/O_2/H_2$, and $CO/CH_4/O_2/H_2$ at low temperature of 750° C. or lower to produce a non-equilibrium plasma, and contacting the plasma with the surface of the plasma held outside the area irradiated with the microwave to form the highly crystallized diamond thin film on the substrate; the substrate comprising a glass substrate having a softening point lower than 920° C.

* * * * *